United States Patent
Noma

(10) Patent No.: US 7,860,138 B2
(45) Date of Patent: Dec. 28, 2010

(54) SEMICONDUCTOR LASER LIGHT EMITTING DEVICE AND METHOD FOR MANUFACTURING SAME

(75) Inventor: Tsuguki Noma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 162 days.

(21) Appl. No.: 12/083,913

(22) PCT Filed: Oct. 16, 2006

(86) PCT No.: PCT/JP2006/320538

§ 371 (c)(1),
(2), (4) Date: Apr. 21, 2008

(87) PCT Pub. No.: WO2007/046317

PCT Pub. Date: Apr. 26, 2007

(65) Prior Publication Data

US 2009/0168824 A1    Jul. 2, 2009

(30) Foreign Application Priority Data

Oct. 21, 2005 (JP) .............................. 2005-307194

(51) Int. Cl.
*H01S 5/00* (2006.01)
(52) U.S. Cl. .............. 372/45.01; 372/43.01; 372/50.121
(58) Field of Classification Search ..... 372/43.01–50.1, 372/50.12–50.122
See application file for complete search history.

(56) References Cited

U.S. PATENT DOCUMENTS

| | | | |
|---|---|---|---|
| 5,396,508 A | 3/1995 | Bour et al. | |
| 6,546,035 B2 | 4/2003 | Imafuji et al. | |
| 6,567,449 B1 | 5/2003 | Ashida | |
| 6,813,290 B1 * | 11/2004 | Fukuhisa | 372/43.01 |
| 2002/0022285 A1 | 2/2002 | Narui | |

FOREIGN PATENT DOCUMENTS

| | | |
|---|---|---|
| JP | 5-90699 | 4/1993 |
| JP | 6-120614 | 4/1994 |

(Continued)

OTHER PUBLICATIONS

International Search Report from the corresponding PCT/JP2006/320538, mailed Nov. 7, 2006.

*Primary Examiner*—Minsun Harvey
*Assistant Examiner*—Xnning Niu
(74) *Attorney, Agent, or Firm*—Hamre, Schumann, Mueller & Larson, P.C.

(57) ABSTRACT

A semiconductor laser device 1 includes infrared and red laser elements 3, 4 provided on a substrate 2, where the infrared element 3 includes a laminate of a first lower clad layer 11, a first active layer 12 and a first upper clad layer 13, and the red element 4 includes a laminate of a second lower clad layer 21, a second active layer 22 and a second upper clad layer 23. The clad layer 11 includes a third lower clad layer 17 formed on the substrate 2, an etching stop layer 18 formed on the third lower clad layer 17, and a fourth lower clad layer 19 formed on the etching stop layer 18 at a region provided with the infrared element 3. The second lower clad layer 21 is formed on the etching stop layer 18 except at the region of the infrared element 3.

3 Claims, 5 Drawing Sheets

FOREIGN PATENT DOCUMENTS

| | | |
|---|---|---|
| JP | 2000-307191 | 11/2000 |
| JP | 2001-68785 | 3/2001 |
| JP | 2001-217504 | 8/2001 |
| JP | 2001-244569 | 9/2001 |
| JP | 2001-320132 | 11/2001 |
| JP | 2002-368335 | 12/2002 |

* cited by examiner

SEMICONDUCTOR LASER LIGHT EMITTING DEVICE AND METHOD FOR MANUFACTURING SAME

TECHNICAL FIELD

The present invention relates to a semiconductor laser emitting device including an infrared laser emitting element and a red laser emitting element, and it also relates to a method for manufacturing such a semiconductor laser device.

BACKGROUND ART

An example of conventional dual wavelength semiconductor laser device is disclosed in Patent Document 1. The laser device includes an infrared laser emitting element and a red laser emitting element, both arranged side by side on a single substrate. Such a semiconductor laser device is said to have a monolithic structure. The infrared laser emitting element and the red laser emitting element emit laser beams of different wavelengths.

The infrared laser emitting element has a laminated structure made up of an n-type first lower clad layer, a first active layer and a p-type first upper clad layer. The red laser emitting element has a laminated structure made up of an n-type second lower clad layer, a second active layer and a p-type second upper clad layer.

The semiconductor laser device is manufactured as follows. First, a first laminate is formed over the upper surface of a substrate. The first laminate is made up of an n-type first lower clad layer, a first active layer and a p-type first upper clad layer, where these layers are laminated one upon another in the mentioned order. Then, a first etching step is performed to remove part of the first laminate other than the portion which is to become an infrared laser emitting element. As a result, the upper surface of the substrate is exposed except the portion on which the infrared laser emitting element is to be formed.

After the first etching step, a second laminate is formed on both the exposed portion of the upper surface of the substrate and the portion to become the infrared laser emitting element. The second laminate is made up of an n-type second lower clad layer, a second active layer and a p-type second upper clad layer, where these layers are laminated one upon another in the mentioned order. Then, a second etching step is performed to remove part of the second laminate other than the portion which is to become a red-laser emitting element.

Patent Document 2 discloses another conventional semiconductor laser device having a different structure. This semiconductor laser device includes an embankment layer (height adjustment buffer layer) formed between the substrate of a red laser emitting element and the second lower clad layer. With this feature, the semiconductor laser device disclosed in Patent Document 2 differs from the device disclosed in Patent Document 1.

The semiconductor laser device of Patent Document 2 is manufactured as follows. First, a first laminate is formed over the upper surface of a substrate. The first laminate is made up of an n-type first lower clad layer, a first active layer and a p-type first upper clad layer, where the these layers are laminated one upon another in the mentioned order. Then, a first etching step is performed to remove part of the first laminate other than the portion which is to become an infrared laser emitting element. As a result, the upper surface of the substrate is exposed except the portion on which the infrared laser emitting element is to be formed.

After the first etching step, an embankment layer (height adjustment buffer layer) is formed on the exposed portion of the upper surface of the substrate. Then, a second laminate is formed on the embankment layer and on the portion to become the infrared laser emitting element. The second laminate is made up of an n-type second lower clad layer, a second active layer and a p-type second upper clad layer, where these layers are laminated one upon another in the mentioned order. Then, a second etching step is performed to remove part of the second laminate other than the portion which is to become a red laser emitting element.

Patent Document 1: JP-A-2001-244569
Patent Document 1: JP-A-2001-320132

In the above semiconductor laser devices, circumstances relating to e.g. the assembling process or desired optical properties necessitate substantially equal heights for the first active layer of the infrared laser emitting element and the second active layer of the red laser emitting element, as measured from the upper surface of the substrate.

Meanwhile, the second lower clad layer of the red laser emitting element differs in composition from the first lower clad layer of the infrared laser emitting element. This difference permits the second lower clad layer to be made considerably thinner than the first lower clad layer.

In the manufacturing method disclosed in Patent Document 1, the thickness of the second lower clad layer of the second laminate is made equal to that of the first lower clad layer of the first laminate, so that the first active layer and the second active layer have substantially equal heights. While the second laminate can be made thinner as noted above, the thickness of the second lower clad layer is made considerably large for equalizing the heights of the first active layer and the second active layer. Accordingly, the film formation for forming the second lower clad layer requires a lot of time.

Moreover, in the manufacturing method described in Patent Document 1, a large amount of material is required for making the thick second lower clad layer, which leads to a considerable increase in the manufacturing cost.

In the manufacturing method of Patent Document 2, on the other hand, the embankment layer is formed on the portion exposed by the first etching, and on the upper surface of this embankment layer is formed the second lower clad layer. In this manner, the thickness of the second lower clad layer can be reduced by as much as the thickness of the embankment layer. In addition, by adjusting the thickness of the second lower clad layer, the first active layer and the second active layer can be made substantially equal in height.

However, the manufacturing method of Patent Document 2 requires the additional film formation step for forming the embankment layer, performed after the first etching step for forming the first laminate. Unfavorably, the additional step leads to a considerable increase in the manufacturing cost.

DISCLOSURE OF THE INVENTION

The present invention has been proposed under the above-described circumstances. It is, therefore, an object of the present invention is to provide a semiconductor laser emitting device capable of solving the above-described problems and to provide a method for manufacturing such a semiconductor laser emitting device.

According to a first aspect of the present invention, there is provided a semiconductor laser emitting device comprising an infrared laser emitting element for infrared light emission including a first lower clad layer, a first active layer and a first upper clad layer which are laminated one upon another, and a red laser emitting element for red light emission including a second lower clad layer, a second active layer and a second upper clad layer which are laminated one upon another. The infrared laser emitting element and the red laser emitting element are provided on an upper surface of a single substrate. The first lower clad layer comprises a third lower clad layer formed on the entire upper surface of the substrate, an etching stop layer formed on an entire upper surface of the third lower clad layer, and a fourth lower clad layer formed on an upper surface of the etching stop layer at a region at which the infrared laser emitting element is formed. The second lower clad layer is formed on the upper surface of the etching stop layer except the region at which the infrared laser emitting element is formed.

Preferably, the first active layer and the second active layer are substantially equal to each other in height from the upper surface of the substrate owing to the third lower clad layer and the etching stop layer.

Preferably, the third lower clad layer and the fourth lower clad layer are made of n-type AlGaAs, the etching stop layer is made of InGaP, the first active layer is made of AlGaAs, the second lower clad layer is made of n-type InGaAlP and the second active layer is made of InGaP.

According to a second aspect of the present invention, there is provided a method for manufacturing a semiconductor laser emitting device including an infrared laser emitting element and a red laser emitting element which are provided on an upper surface of a single substrate. The method comprises a first epitaxial step for forming a first laminate by forming a third clad layer constituting a first lower clad layer on an entire upper surface of a substrate, forming an etching stop layer on an entire upper surface of the third lower clad layer, forming a fourth lower clad layer constituting the first lower clad layer on an entire upper surface of the etching stop layer, forming a first active layer on an upper surface of the fourth lower clad layer and forming a first upper clad layer on an upper surface of the first active layer; a first etching step of removing part of the first laminate except a portion to become the infrared laser emitting element to expose the upper surface of the etching stop layer except at the portion to become the infrared laser emitting element. The method also comprises: a second epitaxial step for forming a second laminate by forming a second lower clad layer on the first laminate which is left in the first etching step and the upper surface of the etching stop layer which is exposed by the first etching step, forming a second active layer on an upper surface of the second lower clad layer and forming a second upper clad layer on an upper surface of the second active layer; and a second etching step of removing the second laminate except a portion to become the red laser emitting element.

BEST MODE FOR CARRYING OUT THE INVENTION

Preferred embodiments of the present invention will be described below with reference to the accompanying drawings.

Figure 1:
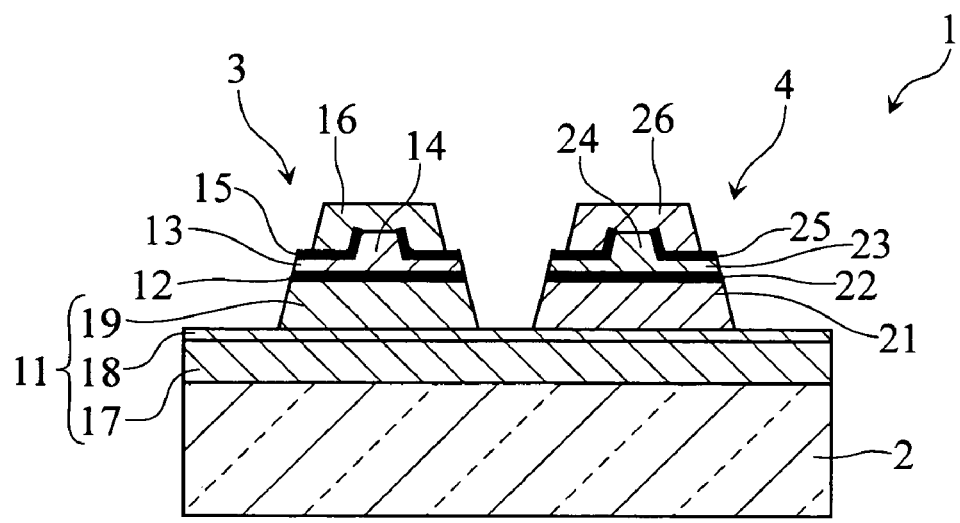
FIG. 1 is a sectional view showing a semiconductor laser emitting device according to a first embodiment of the present invention.

FIG. 1 is a sectional front view showing a semiconductor laser emitting device according to a first embodiment of the present invention.

The laser emitting device 1 includes a substrate 2, an infrared laser emitting element 3 for infrared light emission and a red laser emitting element 4 for red light emission. The infrared laser emitting element 3 and the red laser emitting element 4 emit laser beams of different wavelengths. The substrate 2 may be made of n-type GaAs, for example. The infrared laser emitting element 3 and the red laser emitting element 4 are provided on an upper surface of the substrate 2.

The infrared laser emitting element 3 is made up of a first lower clad layer 11, a first active layer 12, a first upper clad layer 13, a first ridge 14, a first buried layer 15 and a first contact layer 16.

The first lower clad layer 11 is made up of a third clad layer 17, an etching stop layer 18 and a fourth clad layer 19. The third lower clad layer 17 is formed on the entire upper surface of the substrate 2. The etching stop layer 18 is formed on the upper surface of the third lower clad layer 17. The etching stop layer 18 has a relatively small thickness. The fourth lower clad layer 19 is formed on the upper surface of the etching stop layer 18 at a region at which the infrared laser emitting element 3 is formed. The third clad layer 17 and the fourth clad layer 19 may be made of n-type AlGaAs, for example. The etching stop layer 18 may be made of InGaP, for example.

The first active layer 12 is formed on the upper surface of the fourth lower clad layer 19. The first active layer 12 may be made of AlGaAs with emission wavelength of 750 to 850 nm. The first upper clad layer 13 is formed on the upper surface of the first active layer 12. The first upper clad layer 13 may be made of p-type AlGaAs, for example.

The first ridge 14 is formed at the center of the upper surface of the first upper clad layer 13. The first buried layer 15 is formed on the upper surface of the first upper clad layer 13 and the side surfaces of the first ridge 14. The first buried layer 15 may be made of n-type AlGaAs, for example. The first contact layer 16 is formed on the upper surface of the first buried layer 15. The first contact layer 16 may be made of p-type GaAs, for example.

The red laser emitting element 4 is made up of a second lower clad layer 21, a second active layer 22, a second upper clad layer 23, a second ridge 24, a second buried layer 25 and a second contact layer 26.

The second lower clad layer 21 is formed on the upper surface of the etching stop layer 18. The second lower clad layer 21 may be made of n-type InGaAlP, for example. The second active layer 22 is formed on the upper surface of the second lower clad layer 21. The second active layer 22 may be made of InGaP with emission wavelength of 635 to 680 nm. The second upper clad layer 23 is formed on the upper surface of the second active layer 22. The second upper clad layer 23 may be made of p-type InGaAIP, for example.

The second ridge 24 is formed at the center of the upper surface of the second upper clad layer 23. The second buried layer 25 is formed on the upper surface of the second upper clad layer 23 and on the side surfaces of the second ridge 24. The second buried layer 25 may be made of n-type InAIP or n-type InGaAIP, for example. The second contact layer 26 is formed on the upper surface of the second buried layer 25. The second contact layer 26 may be made of p-type GaAs, for example.

As described above, in the laser emitting device 1, the third lower clad layer 17 of the first lower clad layer 11, which is part of the infrared laser emitting element 3, is formed on the entire upper surface of the substrate 2. Further, the etching stop layer 18 is formed on the entire upper surface of the third lower clad layer 17. The fourth lower clad layer 19, which is part of the infrared laser emitting element 3, and the second lower clad layer 21, which is part of the red laser emitting element 4, are formed on the upper surface of the etching stop layer 18.

With the above arrangement, the second lower clad layer 21 is formed on the substrate 2 via the etching stop layer 18 and the third lower clad layer 17. This arrangement ensures that the first active layer 12 of the infrared laser emitting element 3 and the second active layer 22 of the red laser emitting element 4 are substantially equal to each other in height from the upper surface of the substrate 2. Thus, the portions of the etching stop layer 18 and third lower clad layer 17 on which the second lower clad layer 21 is formed perform the same function as that of the embankment layer of the laser emitting device disclosed in Patent Document 2.

Thus, differing from the laser emitting device disclosed in Patent Document 1, it is not necessary to make the second lower clad layer of the red laser emitting element thick. Thus, the time required for the film formation of the second lower clad layer is relatively short, and the amount of the material required for the film formation of the second lower clad layer is relatively small. Moreover, unlike the laser emitting device disclosed in Patent Document 2, it is not necessary to form an embankment layer. Thus, the film formation step for forming the embankment layer does not need to be performed additionally, so that the manufacturing cost is prevented from increasing.

In the above-described structure, the band gap of the etching stop layer 18 is larger than that of the first active layer 12. Thus, the absorption or loss of infrared light by the etching stop layer 18 is relatively small. Further, the band gap of the third lower clad layer 17 is larger than that of the second active layer 22. Thus, the absorption or loss of red light by the third lower clad layer 17 is relatively small. Thus, the infrared laser emitting element 3 and the red laser emitting element 4 exhibit a high luminance.

A method for manufacturing the laser emitting device 1 according to the first embodiment will be described below with reference to FIGS. 2-9.

Figure 2:
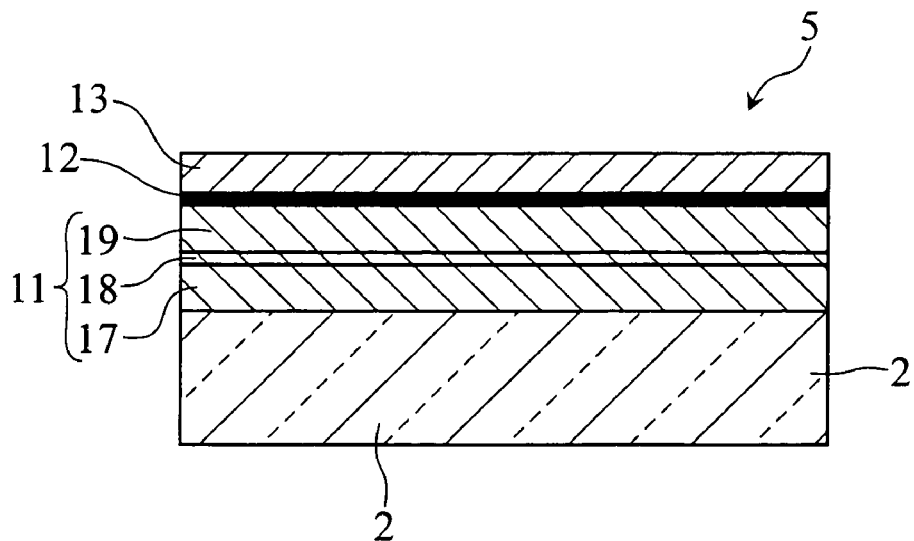
FIG. 2 shows a method for manufacturing the laser emitting device shown in FIG. 1.

First, a first epitaxial step for forming a first laminate 5 is performed. In the first epitaxial step, a third lower clad layer 17 of a first lower clad layer 11 is formed on the entire upper surface of a substrate 2, as shown in FIG. 2. An etching stop layer 18 is formed on the upper surface of the third lower clad layer 17. A fourth lower clad layer 19 is formed on the upper surface of the etching stop layer 18. A first active layer 12 is formed on the fourth lower clad layer 19. A first upper clad layer 13 is formed on the upper surface of the first active layer 12. In this way, the first laminate 5 is formed.

Specifically, to form the first lower clad layer 11, Al, Ga and As are supplied to grow the third lower clad layer 17. Then, the etching stop layer 18 is formed by e.g. stopping the supply of Al and As and supplying In and P for a predetermined time period. Then, the fourth lower clad layer 19 is grown by stopping the supply of In and P and supplying Al and As again.

In this way, the first lower clad layer 11 is formed by changing the materials in the film formation step, and a film formation step for independently forming the etching stop layer 18 is not necessary. Thus, the manufacturing cost is reduced.

Alternatively, the etching stop layer 18 may be formed by changing the mixing ratio of the film formation material for a predetermined time period after the third lower clad layer 17 is grown.

Then, the process proceeds to a first etching step. In the first etching step, the portion of the first laminate 5 which is to become an infrared laser emitting element 3 is masked. In this state, portions of the first laminate 5 are removed by an etchant except the portion to become the infrared laser emitting element 3.

Figure 3:
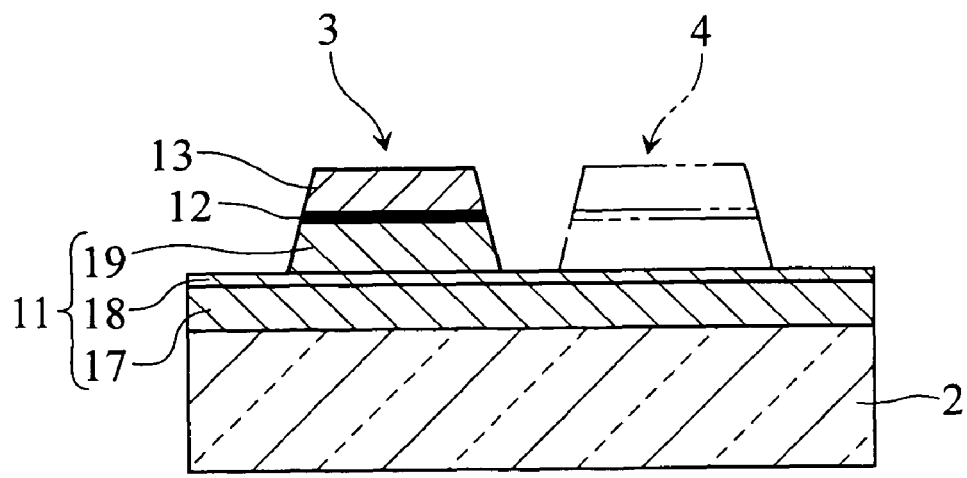
FIG. 3 shows the method for manufacturing the laser emitting device shown in FIG. 1.

As shown in FIG. 3, in the first etching step, the portions of the first laminate 5 on the upper side of the etching stop layer 18 are removed except the masked portion. By this technique, the portion to become an infrared laser emitting element 3 is obtained, with the third lower clad layer 17 left on the entire upper surface of the substrate 2.

By the first etching step, the etching stop layer 18 is exposed at a portion on which a red laser emitting element 4 is to be formed.

When the etching stop layer 18 contains Al (aluminum) an oxide film of Al (aluminum) may be formed on the surface of the etching stop layer 18 exposed by the first etching step. In the first embodiment, however, the etching stop layer 18 is made of a material, such as InGaP, which does not contain Al (aluminum). Thus, the formation of an oxide film of a metal such as Al (aluminum) on the surface of the etching stop layer 18 exposed by the first etching step is reliably prevented.

Thus, in forming a second lower clad layer 21 after the first etching step, the work for removing an oxide film from the surface of the etching stop layer 18 is not necessary. Further, a buffer layer for avoiding the adverse affect of an oxide film does not need to be formed. Thus, the manufacturing cost is reduced.

Figure 4:
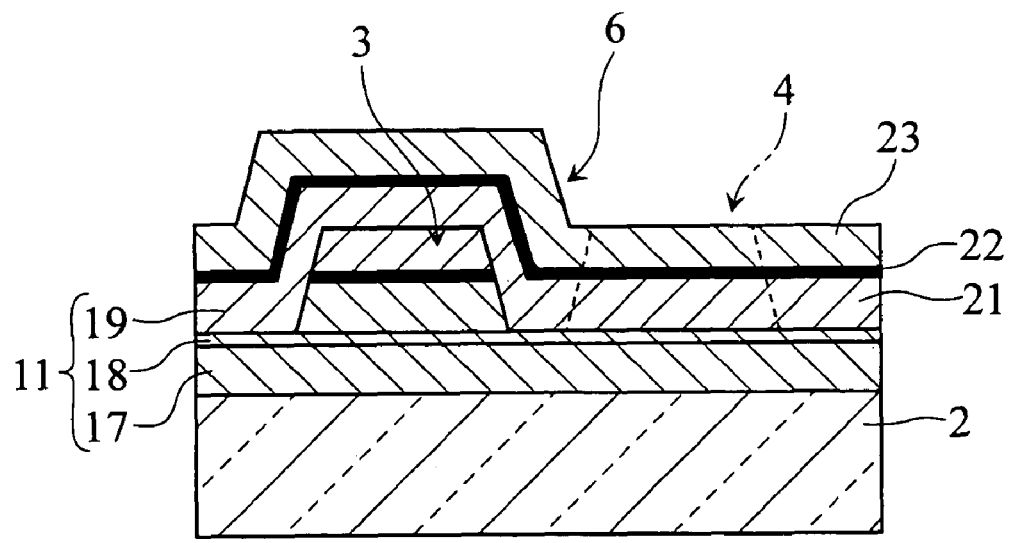
FIG. 4 shows the method for manufacturing the laser emitting device shown in FIG. 1.

Then, the process proceeds to a second epitaxial step for forming a second laminate 6. In the second epitaxial step, as shown in FIG. 4, a second lower clad layer 21 is formed on the portion to become an infrared laser emitting element 3 and on the entirety of the exposed portion of the etching stop layer 18. A second active layer 22 is formed on the upper surface of the second lower clad layer 21. A second upper clad layer 23 is formed on the upper surface of the second active layer 22. In this way, the second laminate 6 is formed.

Then, the process proceeds to a second etching step. In the second etching step, the portion of the second laminate 6 which is to become a red laser emitting element 4 is masked. In this state, portions of the second laminate 6 are removed by an etchant except the portion to become the red laser emitting element 4.

Figure 5:
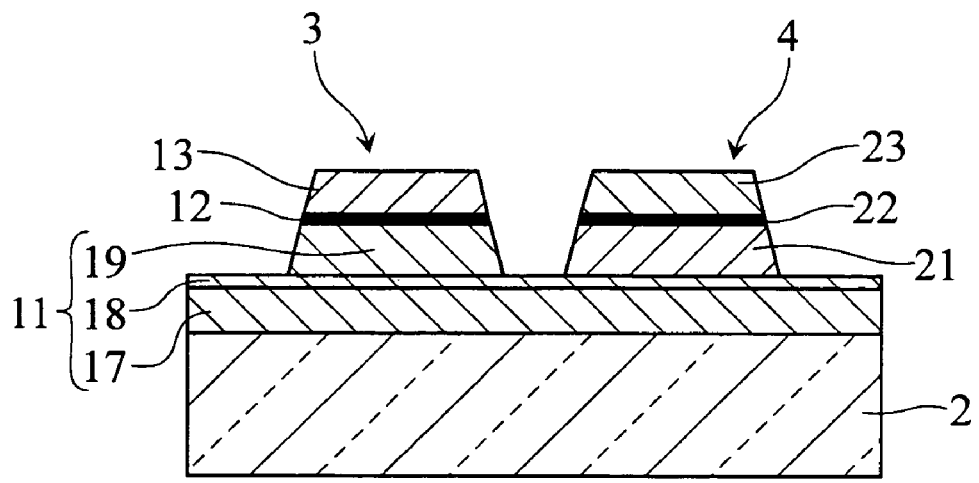
FIG. 5 shows the method for manufacturing the laser emitting device shown in FIG. 1.

In the second etching step, the second laminate 6 is removed except the masked portion. As a result, as shown in FIG. 5, the portion to become a red laser emitting element 4 is provided on the upper surface of the etching stop layer 18.

Figure 6:
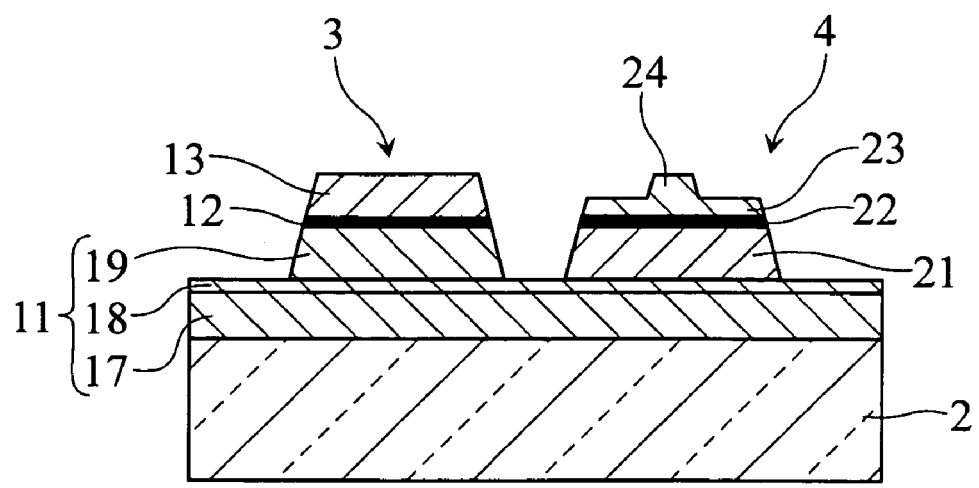
FIG. 6 shows the method for manufacturing the laser emitting device shown in FIG. 1.
Figure 7:
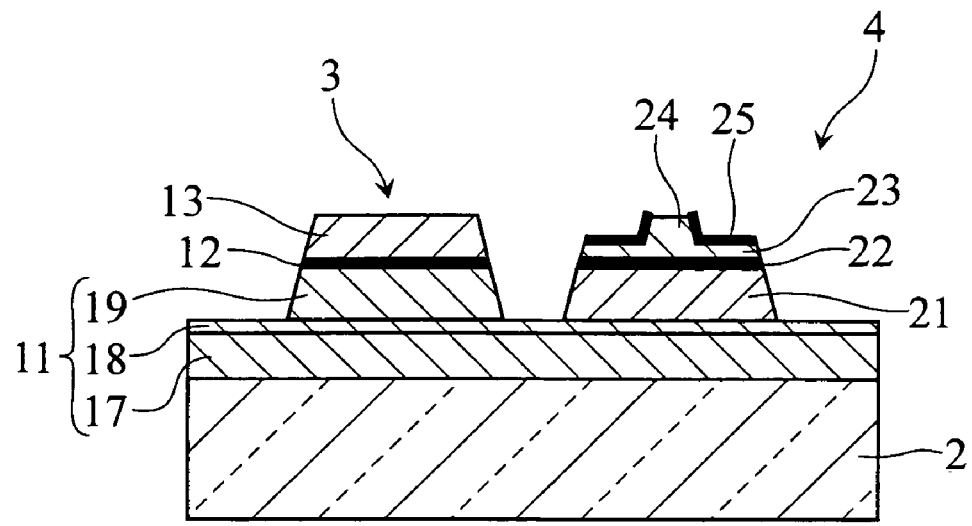
FIG. 7 shows the method for manufacturing the laser emitting device shown in FIG. 1.

Then, as shown in FIG. 6, a second ridge 24 is formed on the upper surface of the second upper clad layer 23. Thereafter, as shown in FIG. 7, a third epitaxial step for forming a second buried layer 25 is performed.

Figure 8:
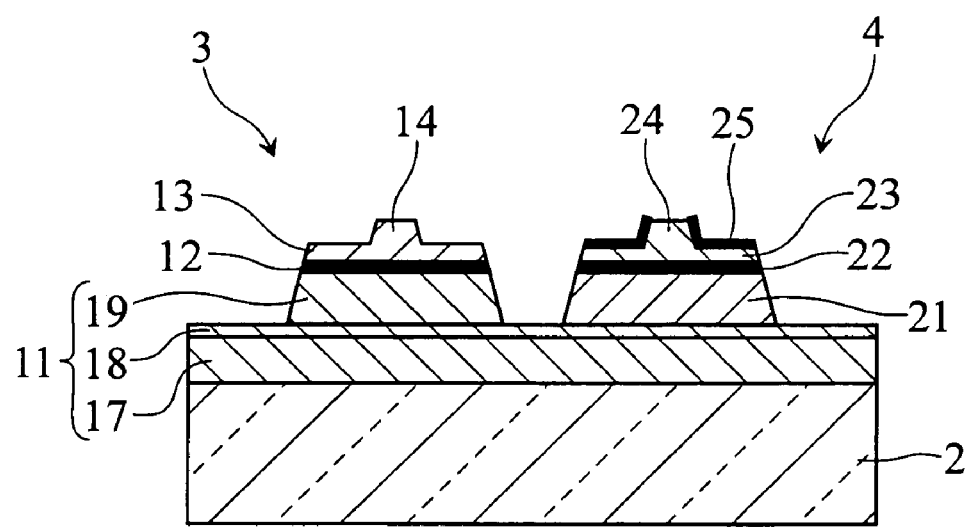
FIG. 8 shows the method for manufacturing the laser emitting device shown in FIG. 1.
Figure 9:
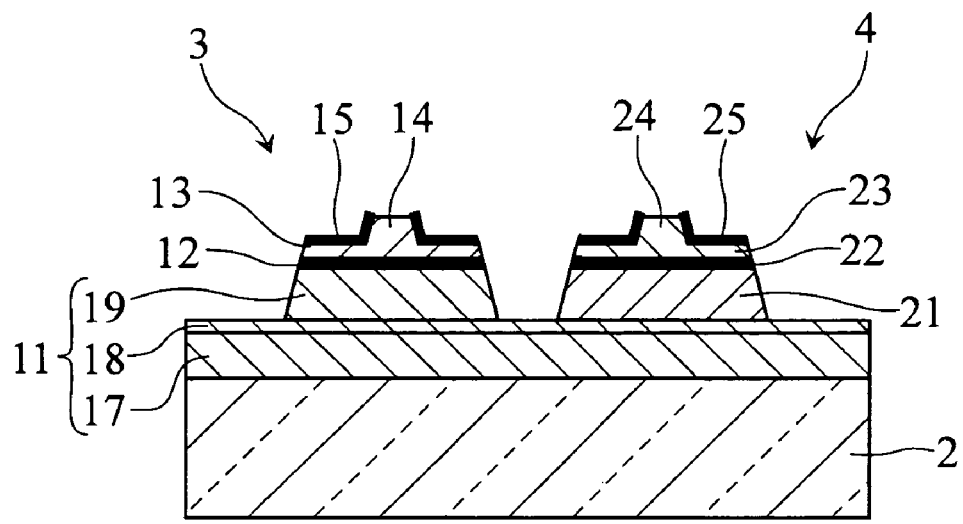
FIG. 9 shows the method for manufacturing the laser emitting device shown in FIG. 1.

Then, as shown in FIG. 8, a first ridge 14 is formed on the upper surface of the first upper clad layer 13. Thereafter, as shown in FIG. 9, a fourth epitaxial step for forming a first buried layer 15 is performed.

Then, a fifth epitaxial step is performed to form a first contact layer 16 and a second contact layer 26 on the first buried layer 15 and the second buried layer 25, respectively. By these process steps, the laser emitting device 1 having the structure shown in FIG. 1 is manufactured.

Figure 10:
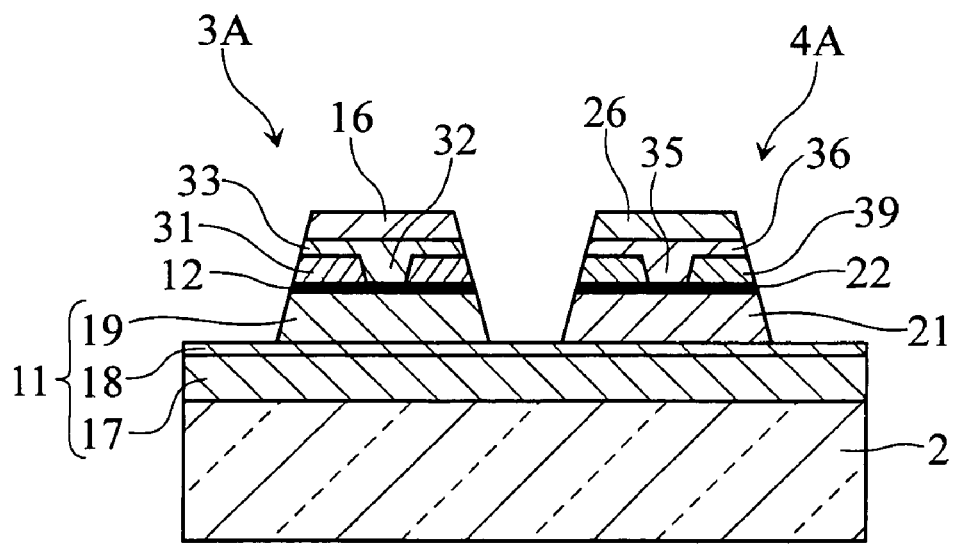
FIG. 10 is a sectional view showing a semiconductor laser emitting device according to a second embodiment of the present invention.

FIG. 10 is a sectional view showing a semiconductor laser emitting device according to a second embodiment of the present invention. The laser emitting device 1A according to the second embodiment differs from the laser emitting device 1 of the first embodiment in structure of the first upper clad layer 13 and the first buried layer 15 of the infrared laser emitting element 3 and the second upper clad layer 23 and the second buried layer 25 of the red laser emitting element 4 (see FIG. 1). In FIG. 10, the members designated by the same reference signs as those used in FIG. 1 have the same function as that of the members shown in FIG. 1.

In the infrared laser emitting element 3A, a first buried layer 31 is formed on the upper surface of the first active layer 12. The first buried layer 31 may be made of n-type AlGaAs, for example. A first upper clad layer 32 is formed on the upper surface of the first buried layer 31. The first upper clad layer 32 may be made of p-type AlGaAs, for example. A first ridge 33 is formed at the center of the lower surface of the first upper clad layer 32. The first upper clad layer 32 is held in contact with the first active layer 12 via the first ridge 33.

In the red laser emitting element 4A, a second buried layer 34 is formed on the upper surface of the second active layer 22. The second buried layer 34 may be made of n-type InAlP or n-type InGaAlP, for example. A second upper clad layer 35 is formed on the upper surface of the second buried layer 34. The second upper clad layer 35 may be made of p-type InGaAlP, for example. A second ridge 36 is formed at the center of the lower surface of the second upper clad layer 35. The second upper clad layer 35 is held in contact with the second active layer 22 via the second ridge 36.

In the laser emitting device 1A according to the second embodiment again, the third lower clad layer 17 and the etching stop layer 18 are formed on the entire upper surface of the substrate 2. Thus, the same advantages as those of the laser emitting device 1 according to the first embodiment are obtained.

The invention claimed is:

1. A semiconductor laser emitting device comprising:
  a single substrate made of n-type GaAs and including an upper surface;
  an infrared laser emitting element for infrared light emission, the infrared laser emitting element including a laminate made up of a first lower clad layer, a first active layer and a first upper clad layer; and
  a red laser emitting element for red light emission, the red laser emitting element including a laminate made up of a second lower clad layer, a second active layer and a second upper clad layer; the infrared laser emitting element and the red laser emitting element being provided on the upper surface of the substrate,
  wherein the first lower clad layer comprises:
  a third lower clad layer made of n-type AlGaAs and formed entirely on the upper surface of the substrate;
  an etching stop layer formed entirely on an upper surface of the third lower clad layer; and
  a fourth lower clad layer formed on and held in direct contact with an upper surface of the etching stop layer at a region provided with the infrared laser emitting element, the fourth lower clad layer being made of n-type AlGaAs, and
  wherein the second lower clad layer is formed on the upper surface of the etching stop layer except the region provided with the infrared laser emitting element.

2. The semiconductor laser emitting device according to claim 1, wherein the first active layer and the second active layer are substantially equal to each other in height as measured from the upper surface of the substrate owing to the third lower clad layer and the etching stop layer.

3. The semiconductor laser emitting device according to claim 1, wherein the etching stop layer is made of InGaP, the first active layer is made of AlGaAs, the second lower clad layer is made of n-type InGaAlP and the second active layer is made of InGaP.

* * * * *